(12) United States Patent
Yoon et al.

(10) Patent No.: US 6,208,147 B1
(45) Date of Patent: Mar. 27, 2001

(54) METHOD OF AND APPARATUS FOR MEASURING BATTERY CAPACITY BY IMPEDANCE SPECTRUM ANALYSIS

(75) Inventors: Chul Oh Yoon; Yevgen Barsukov, both of Taejeon; Jong Hyun Kim, Seoul, all of (KR)

(73) Assignee: Korea Kumho Petrochenical Co., Ltd., Chongno-ku ( * ) Notice: Subject to any disclaimer, the term of this patent is extended or adjusted under 35 U.S.C. 154(b) by 0 days.

(21) Appl. No.: 09/260,438

(22) Filed: Mar. 2, 1999

(30) Foreign Application Priority Data

Jun. 16, 1998 (KR) .................................................. 98-22540

(51) Int. Cl.⁷ .................................................. G01N 27/416
(52) U.S. Cl. .................................................. 324/430
(58) Field of Search .................................................. 320/132, 149; 324/427, 430, 432, 433, 436

(56) References Cited

U.S. PATENT DOCUMENTS

| | | | |
|---|---|---|---|
| 3,562,634 | 2/1971 | Latner | 324/29.5 |
| 4,678,998 | 7/1987 | Muramatsu | 324/427 |
| 4,743,855 | 5/1988 | Randin et al. | 324/430 |
| 5,241,275 | 8/1993 | Fang | 324/430 |
| 5,633,801 | 5/1997 | Bottman | 364/482 |
| 5,717,336 | 2/1998 | Basell et al. | 324/430 |
| 6,118,275 | * 9/2000 | Yoon et al. | |

OTHER PUBLICATIONS

Popkirov, G.S., and Schindler, R.N., A New impedance Spectrometer for the Investigation of Electrochemical Systems, *Rev. Sci. Instrum.* 63,5366 (1992).

Ho, C., Raistrick, I.D., and Huggins, R.A., Application of A–C Techniques to the Study of Lithium Diffusion in Tungsten Trioxide Thin Films, *J. Electrochem.Soc.*, vol. 127, No. 2, pp. 343–350 (1980).

Barsoukov, Evgenij, Kim, Jong Hyun, Kim, Jong Hun, Yoon, Chul Oh, Lee, Hosull, Effect of Low–Temperature Conditions on Passive Layer Growth on Li Intercalation Materials, *J. Electrochem. Soc.*, vol. 145, No.8 (1998).

* cited by examiner

*Primary Examiner*—Edward H. Tso
(74) *Attorney, Agent, or Firm*—Davidson, Davidson, Kappel, LLC

(57) ABSTRACT

Provided with a method of measuring battery capacity by impedance spectrum analysis, which is to measure a characteristic impedance spectrum of primary and secondary batteries and determine the battery capacity the method including the steps of: (1) measuring the characteristic impedance spectrum of a battery in a predetermined frequency region; (2) determining a parameter from the measured impedance spectrum; (3) monitoring in advance the correlation between the determined parameter and the battery capacity measured by a real-time discharge technique; and (4) determining the battery capacity from the characteristic impedance spectrum of a battery having an unknown capacity based on the monitored correlation.

11 Claims, 9 Drawing Sheets

METHOD OF AND APPARATUS FOR MEASURING BATTERY CAPACITY BY IMPEDANCE SPECTRUM ANALYSIS

FIELD OF THE INVENTION

The present invention relates to a method of and apparatus for measuring a unknown battery capacity by measuring and analyzing the characteristic impedance spectrum of primary and secondary batteries. Especially, the present invention relates to a method of and apparatus for measuring a unknown battery capacity by the impedance spectrum analysis, which is for the user to measure the battery capacity in a non-destructive way such as measuring a unknown remaining capacity of standardized cell product and grading the standardized capacity of product.

BACKGROUND OF THE RELATED ART

As a widely used measurement for battery capacity there is a real-time discharge method for measuring time td for which a battery connected to an electrical load can supply the power to a constant current Id.

Assuming that the battery capacity is expressed in ampere-hour (Ah). the battery capacity is given by Equation 1 which is used as a standard to evaluate the capacity of battery (e.g., the Korean Industrial Standards).

$$td=Ah/Id \qquad \text{[Equation 1]}$$

The real-time discharge method is to measure the capacity of battery directly and requires a long time for measurement as the battery is discharged in real time. To measure a plurality of batteries at the same time, a plurality of apparatuses is required for discharging the respective batteries separately in the real-time discharge method.

Especially, for the primary battery, the real-time discharge method is inapplicable to the measurement of battery capacity for purpose of quality management of products.

On the other hand, the time for measurement of impedance at a specified frequency is generally shorter than the time required for the real-time discharge method.

The time required for measuring, the impedance characteristic of battery is limited by the lowest frequency of an input/output signal to be measured.

If the result of the impedance measurement has a close correlation with battery capacity, therefore, the battery capacity can be measured more efficiently by measuring the impedance than by using the real-time discharge method.

There has already been reported a method of determining remaining capacity of battery or monitoring battery charge/discharge state by measuring impedance at a specified frequency.

U.S. Pat. No. 3,562,634 describes a method for determining the charge state of a secondary battery especially nickel-cadmium battery, from the measured Faraday's electric capacity by using a bridge.

According to U.S. Pat. No. 3,562,634, the relationship between the internal impedance of battery and the battery capacity substantially depends on the impedance response characteristic of chemical material used as an active material of the battery.

Therefore the specific relationship between the internal impedance of battery and the battery capacity measured at a specified frequency and for a specified kind of battery do not generally applies to determining battery capacity (Refer to Embodiment 4).

More general method of monitoring the state of charge by using the relationship between the internal impedance at a specified frequency and the remaining capacity of storage battery in U.S. Pat. No. 4,678,998, which proposes a method to sense the state of charge continuously by comparing impedances obtained at different frequencies.

Besides, U.S. Pat. No. 4,743,855 describes a method of using two complex impedances separately measured in the lower and higher frequency regions, and U.S. Pat. Nos. 5,241,275 and 5,717,336 disclose the use of the linear impedance characteristic in the lower frequency region. However, the related art method using the relationship between battery capacity and impedance at a specified frequency or in a narrow frequency region is hardly excellent in aspects of efficiency of measurement and accuracy of correlation.

SUMMARY OF THE INVENTION

Accordingly, the present invention is directed to a method of and apparatus for measuring battery capacity by impedance spectrum analysis that substantially obviates one or more of the problems due to limitations and disadvantages of the related art.

An object of the present invention is to provide a novel method of and apparatus for measuring battery capacity by the impedance spectrum analysis, which is to measure an unknown battery capacity accurately by measuring the characteristic impedance spectrum of primary and secondary batteries in a wide frequency band and analyzing the measured characteristic impedance spectrum.

Another object of the present invention is to provide a method of and apparatus for measuring battery capacity by the impedance spectrum analysis, which takes less time than the real-time discharge method and is excellent in efficiency and reliability.

To accomplish the objects of the present invention, a method of measuring battery capacity by impedance spectrum analysis, which is to measure a characteristic impedance spectrum of primary and secondary batteries and determine the battery capacity, includes the steps of: (1) measuring the characteristic impedance spectrum of primary and secondary batteries in a wide frequency range from the lower frequency of several mHz to the higher frequency of several KHz; (2) calculating model parameters by fitting the measured characteristic impedance spectrum to an equivalent circuit with distributed parameters such as resistance, capacitor and transmission line and (3) estimating the unknown battery capacity using parameters obtained in step (2) based on correlation between the capacity measured by the real time discharge method and the model parameters obtained in advance.

The present invention provides a method for measuring battery capacity with high efficiency and reliabiity by analyzing the impedance spectrum in a wide frequency range within short measurement time relative to the real-time discharge method and by determining model parameters of an equivalent circuit based on a close correlation with charge/discharge state of the battery.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the present invention method and apparatus for measuring battery capacity by the impedance spectrum analysis, examples of which are illustrated in the accompanying drawing.

The foregoing description is given in consideration of the characteristic impedance factor related to battery capacity in relation with the electrochemical reaction of an electrode active material related to a charge/discharge of the battery.

The interfacial impedance Zi of substance A adsorbed on the electrode surface in a redox reaction ($A-e^- \approx A^+$) can be expressed as an electrochemical impedance equivalent to a simple electric circuit composed of a series of charge transfer resistance $R_{ct}$, and pseudocapacitance $C_{ps}$, and parallel double layer capacitance $C_{dl}$.

The pscudocapacitance is given by Equation 2.

$$C_{ps} = SFz/(dE/dc)$$

where S is the surface area, F is the Faraday constant, z is the number of transfer charges and dE/dc is a derivative of electrochemical potential upon concentration of adsorbed material.

For simple systems dE/dc can be expressed from Nernst equation, and Equation 2 can be modified as Equation 3.

$$C_{ps} = \frac{F^2 c_0 z}{RT} \frac{\exp\left\{\frac{zF}{RT}(E-E_0)\right\}}{\left[\exp\left\{\frac{zF}{RT}(E-E_0)\right\}+1\right]}$$ [Equation 3]

where $c_O$ and $E_O$ are concentration and electrochemical potential in the equilibrium state, respectively.

The pseudocapacitance is a model parameter related to the amount of material envolved in the redox reaction. For the actual battery, the active material is not simply adsorbed on the surface of electrode but distributed across the space of a porous electrode material, resulting in further complicated reaction kinetics.

Figure 1:
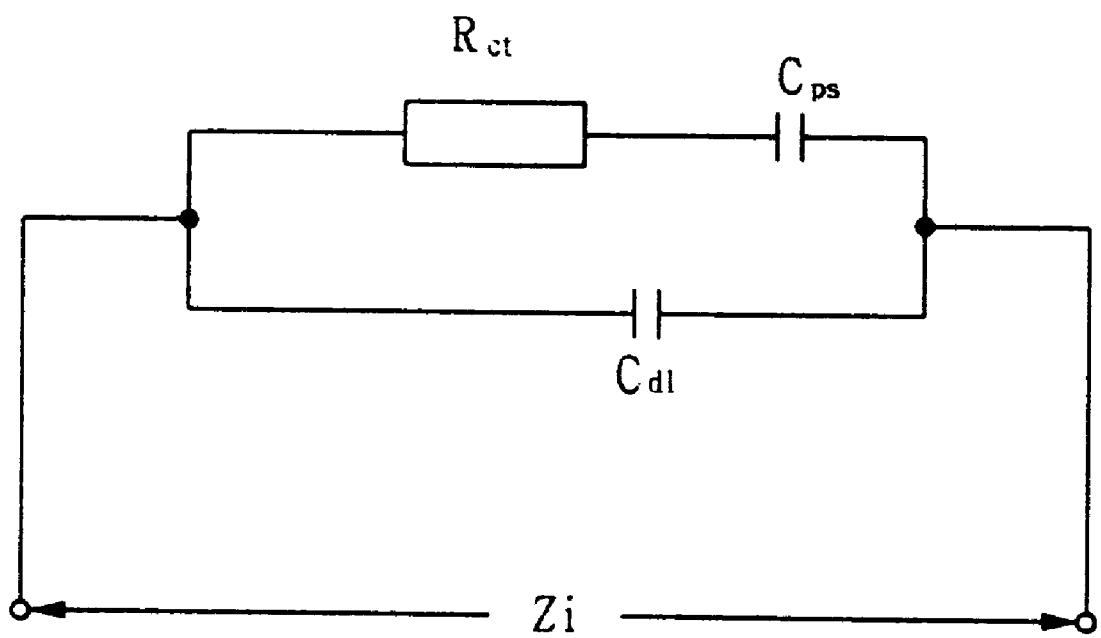
FIG. 1 is a circuit diagram of the equivalent circuit composed of electric elements representing the internal electrochemical reaction of a battery.
Figure 2:
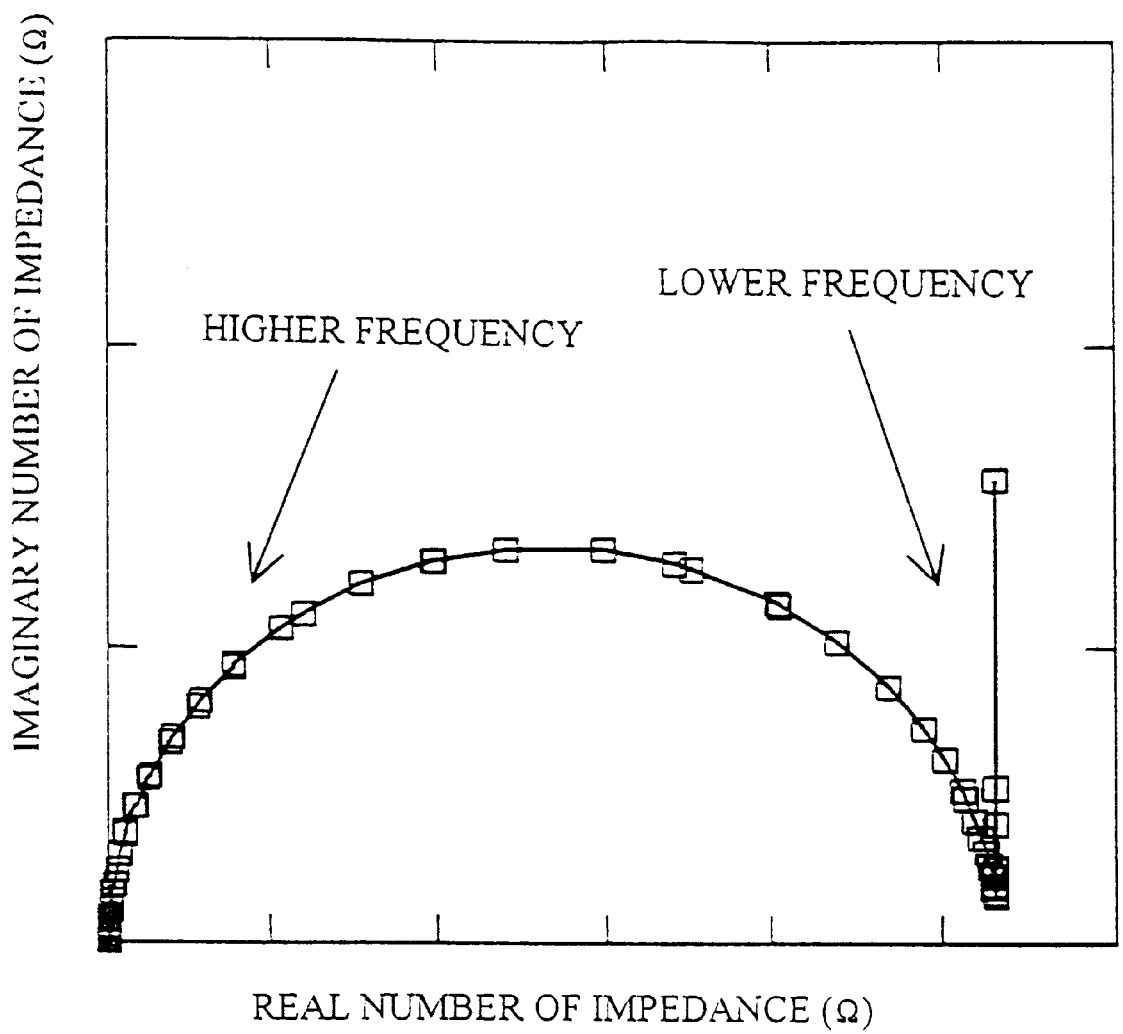
FIG. 2 is a graph showing a complex impedance function for the equivalent circuit shown in FIG. 1.

Since the reaction is generally approximated to an electrode adsorption model at a low frequency of several mHz, the pseudocapacitance can be obtained from the relationship ($Z''=-1/\omega C_{ps}$) with the imaginary value of the complex impedance at the low frequency as illustrated in FIG. 2.

Theoretical treatment of the impedance spectrum of intercalation materials in given in C. Ho, I. R. Raistrick, R. A. Huggins, J. Flectrochem. Soc. 127,343 (1980).

As a measurement for the complex impedance, the Fourier transform method is used by applying a perturbation current signal galvanostatically to both terminals of battery to be measured and by Fourier-transforming a recorded voltage response signal in time domain to frequency domain.

The perturbation current signal used as an input signal is formed by superposition of finite numbers of sinusoidal waves corresponding to multiply selected frequencies. If the lowest frequency is fmin, for example, the oscillation current signal can be composed of $3f_{min}$, $5f_{min}$, $7f_{min}$ and the like.

The finite multiple frequency Fourier transform method is different from that using pulses (U.S. Pat. No. 5,633,801).

The principle of the measurement is disclosed by G. S. Popkirov and R. N. Schindler, Rev. Sci. Instrum., 63,5366 (1992).

The highest frequency that can be determined by the Fourier transform impedance measurement using multiple frequencies is limited by the sampling time of a signal recorder and involves applying an perturbation current for two cycles of the lowest frequency and using only the second cycle in the analysis in order to prevent transfer of a voltage in the lower frequency region.

Compared with a method using frequency response analyzer which employs single frequency perturbation signal, the time required for measuring impedance by Fourier transform reduced by more than about ½ in the lower frequency region (Refer to Embodiment 1).

When measuring impedance by Fourier transform method, it is possible to determine the linearity of the measurement system with respect to the current applied to the battery by comparing magnitudes of complex voltages at applied frequencies and those at unselected frequencies.

This is also an advantage of the Fourier transform impedance measurement, by which the errors of the measurement can be checked and obtained at the same time as the impedance measurement.

Actually, the characteristic impedance spectrum of battery measured as a function of frequency usually differs from the case of ideal interfacial adsorption as illustrated in FIG. 2 when it is expressed on a complex plane.

Figure 3:
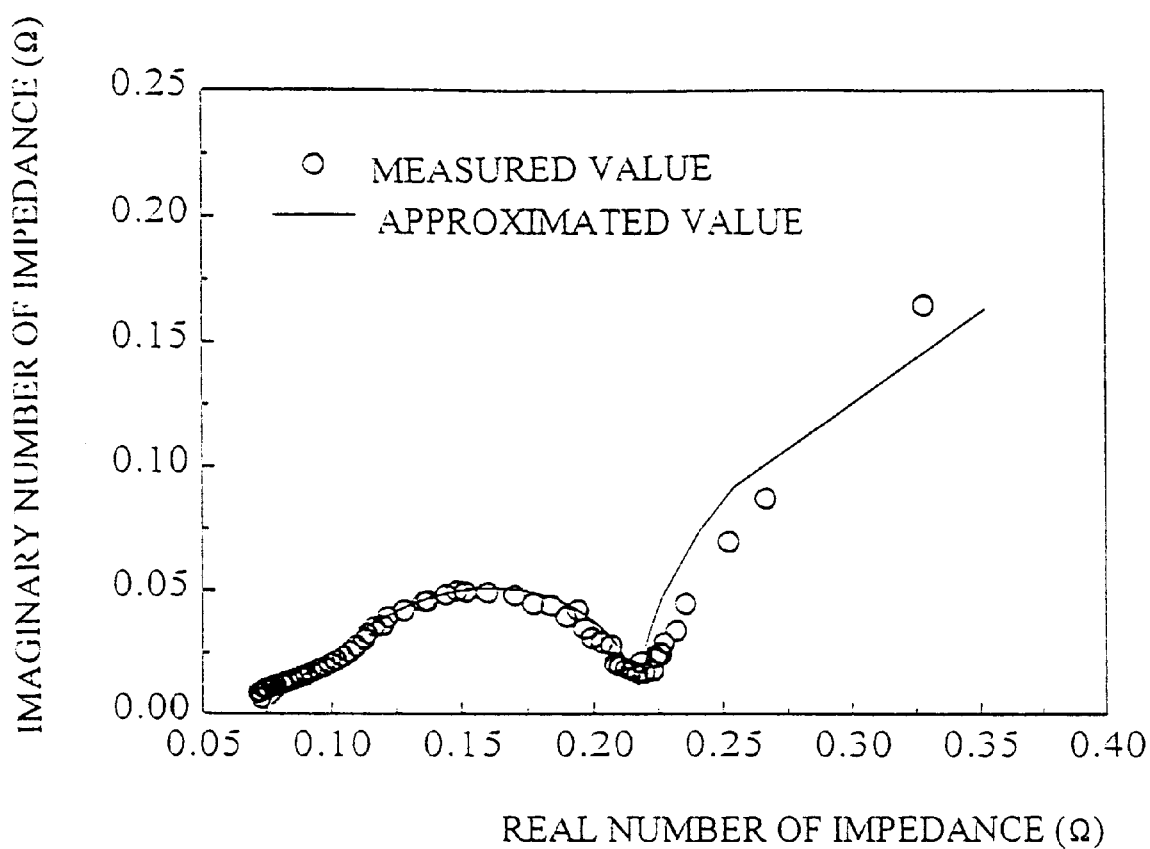
FIG. 3 illustrates the characteristic impedance spectrum measured for a lithium ion battery and results of fitting.

For the typical impedance spectrum (circular part of of data) of lithium ion battery shown in FIG. 3, the semicircular spectrum is contorted into the oval form and has an inclination of 45 degrees in the mid-frequency band.

This phenomenon is characteristic of a battery employing porous electrodes and can be modelled with an equivalent circuit consisting of transmission line as described by E. Barsoukov, J. Hyun Kim, J. Hun Kim, C. O. Yoon, H. Lee, J. Electrochem. Soc. (unissued yet in 1998).

Figure 4:
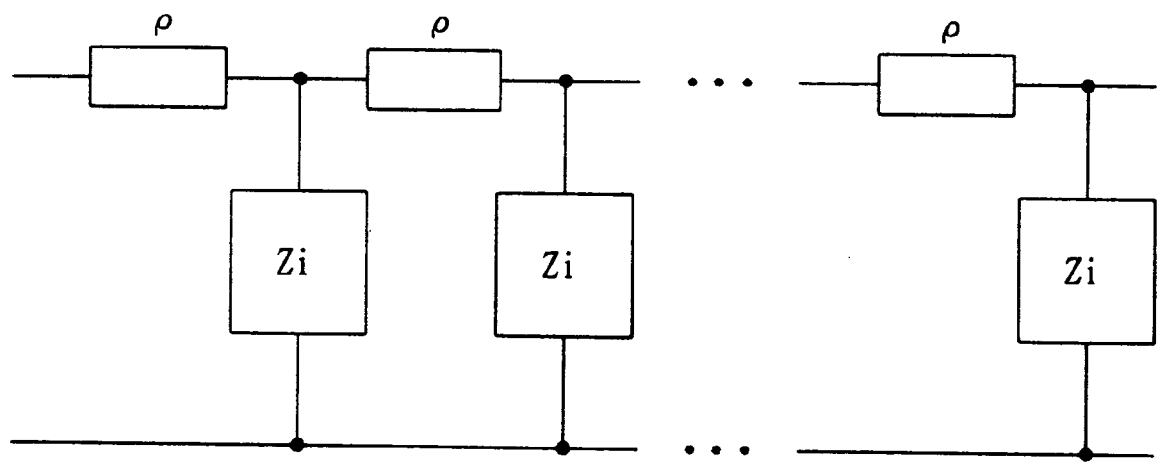
FIG. 4 is an equivalent circuit diagram of a transmission line model, where Zi is a circuit representing electrochemical reeaction as shown in FIG. 1.

As shown in FIG. 4, the transmission line model consists of specific resistance of electrode active material pand interfacial impedance Zi of electrode which are equivalent to distributed serial resistance and distributed parallel impedance in the form of transmission line as usual in electronics.

In the transmission line model, the dc approximation $R_r$ to which the specific resistance of electrode active material contributes and prescribed pseudocapacitance $C_{ps}$ can be model parameters having correlation with battery capacity. The parameters of characteristic impedance function obtained from the solution of differential equation of equivalent circuit in FIG. 4 can be calculated from the measured impedance spectrum by the complex nonlinear least square fitting method.

The complex nonlinear least square fit of lithium ion battery obtained by using the transmission line model is represented by the solid line in FIG. 3.

Thus the fit of impedance spectra provides information concerning the model parameters.

Figure 5:
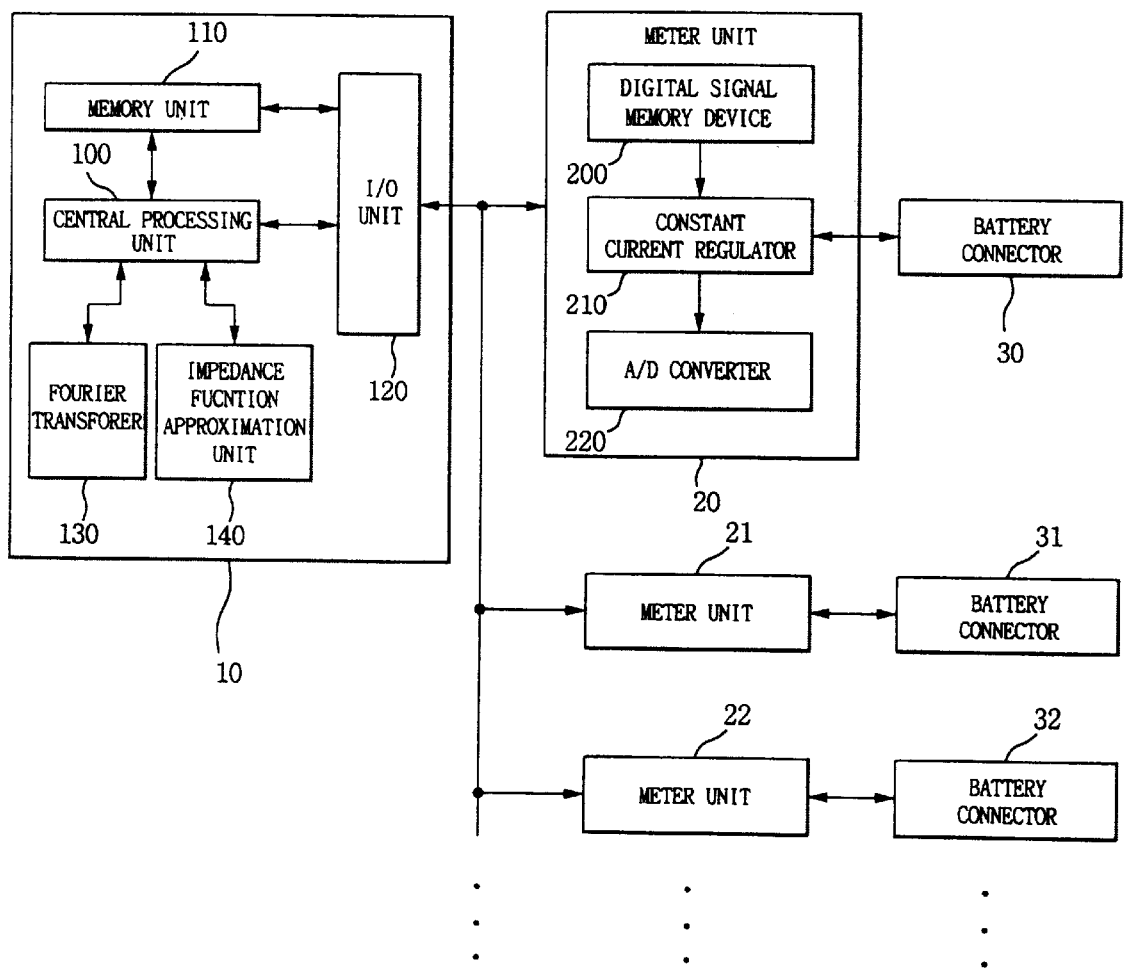
FIG. 5 is a block diagram of a measurement apparatus using multi-channel method in the present invention.

A Fourier transform impedance spectrometer, as illustrated in FIG. 5, has one central control unit 10 and a plurality of spectrometers 20, 21, 22 for measuring the capacity of batteries connected to plural cell connetor 30, 31, 32. The impedance spectrometer can meausure impedance spectra independently with the spectrometers 20, 21, 22 connected to one central control unit 10 via multi-channels.

The central control unit 10 includes a central processing unit 100 for performing a calculation of battery capacity, a memory unit 110 for storing and oututting digital signals of input current and output voltage input from the plural meters 20, 21, 22, and applied to both terminals, an I/O unit 120 for outputting a predetermined control signal to the plural meters 20, 21, 22, and inputting predetermined measured signals output from the plural meters 20, 21, 22 under the control of the central processing unit 100, a Fourier transformer 130 for Fourier transforming the measured values of the plural meters 20, 21, 22, into a complex impedance expressed by a frequency function under the control of the central control unit 100, and an impedance function approximation unit 140 for converting the Fourier transformed complex impedance from the Fourier transformer 130 into a predefined model parameter.

Each of the plural meters 20, 21, 22, includes a digital signal memory device 200 for storing a digital input signal composed of overlapping predefined non-interference selection frequency, a constant current regulator unit 210 for applying an input current corresponding to the digital input signal stored in the digital signal memory device 200 in advance to the both terminals of battery via cell connectors 30, 31, 32, and an A/D) converter 220 for converting input current and output voltage applied to the both terminals of the battery into an analog signal to be fed into the central control unit 10.

In the present invention as constructed above, the constant current regulator 210 applies the input current, which corresponds to the digital input signal composed of predefined non-interference selection frequencies overlapping, to both terminals of a test battery in the memory unit 200 of the plural meters 20, 21, 22, via cell connectors 30, 21, 32.

Input current and output voltage applied to both terminals of test battery are converted to digital signals continuously at the A/D converter 220 and output to the central control unit 10.

The central control unit 10 inputs the digital signals of input current and output voltage applied to both terminals of battery from the A/D converter 220 via I/O unit 120 and stores them in the memory unit 110 instantaneously.

Following the completion of measurement, the central processing unit 100 controls the Fourier transformer 130 to perform a Fourier transform of the result of measurement stored in the memory unit 110 to be converted to a complex impedance expressed by the function of frequency. The complex impedance is fitted to predefined model parameters at the impedance spectrum fitting unit 140.

When measuring a plurality of test batteries in the multi-channel way at the same time, according to the present invention, the central processing unit 100 operates to perform Fourier transform and impedance function approximation sequentially. The time required for such operations may be ignored relative to the time for measuring input and output signals.

A combination of the impedance spectrometer using Fourier transform and general equipment for controlling charge/discharge state in real time can form a very powerful apparatus for measuring and grading battery capacity in manufacture of standardized cell products.

[Embodiment 1]

A Fourier transform impedance spectrometer is manufactured which is designed to apply an input current signal having multiply superposition of sine waves obtained by multiplying odd-numbered times of the lowest frequency to a battery via a 16-bit D/A converter and a galvanostat, and transfer digital current and voltage signals measured by a two-channel 16-bit A/D converter to a computer for calculating a complex impedance by use of the digital discrete Fast Fourier transform algorithm.

The time required for measuring the impedance by Fourier transform method in the lower frequency region is listed in Table 1 for about fifty selection frequencies while fixing a sampling rate at 100 Hz and varying the size of sample and the lowest frequency. The result as listed in Table 1 are compared with those measured by frequency scanning method with a Solatron SI 1255 frequency response analyzer.

TABLE 1

Comparion of Time Required for Impedance Measurement According to the Sample Size.

| Size of Sample | Lowest Frequency (Hz) | Highest Frequency (Hz) | Time for Measurement (second) | |
|---|---|---|---|---|
| | | | Fourier Transform | Frequency Scan |
| 64 | 1.56 | 48.4 | 1 | 4 |
| 256 | 0.39 | 46.5 | 5 | 14 |
| 1024 | 0.098 | 45.2 | 20 | 54 |
| 4096 | 0.024 | 44.0 | 83 | 209 |
| 16384 | 0.0061 | 43.0 | 327 | 805 |
| 65536 | 0.0015 | 42.0 | 1307 | 3123 |

[Embodiment 2]

A lithium ion battery (manufactured by Sony Co.) with regulated capacity of 1300 mAh is charged up to 4.2 volts under condition of constant current for one hour at room temperature and fully charged at the voltage for 2.5 hours under condition of constant voltage. Then use is made of a Fourier transform impedance meter as described in Embodiment 1 in measuring the impedance spectrum in the frequency range from 5 mHz to 20 KHz.

To obtain the impedance spectrum of the same battery in different discharge states, the battery is repeatedly discharged by 130 mAh under condition of constant current and the impedance spectra are measured successively.

Figure 6:
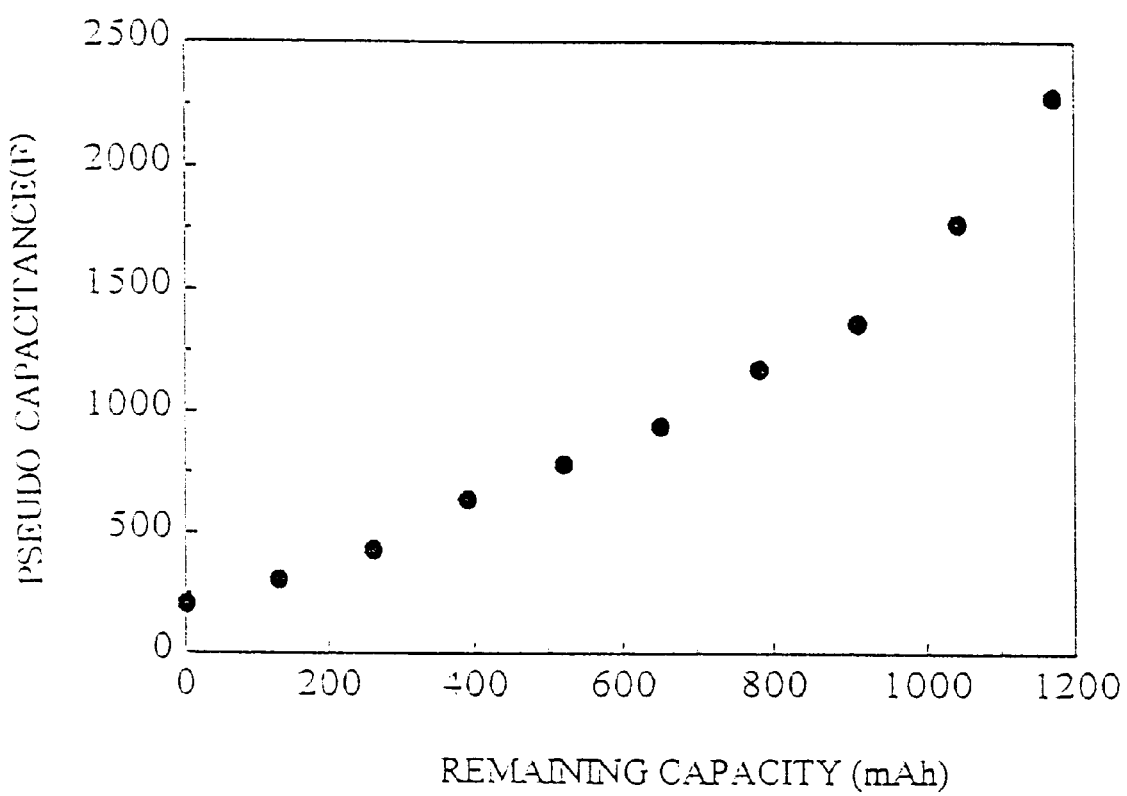
FIG. 6 illustrates a correlation between the remaining capacity of a lithium ion battery based on the discharge state and selected model parameter.

The impedance spectra are approximated by the complex nonlinear least square fitting method for the impedance function corresponding to the transmission line equivalent circuit model shown in FIG. 4 to calculate a model parameter, pseudocapacitance $C_{ps}$. A comparison of the model parameter and remaining capacity in each discharge state measured by the real-time discharge method at constant current for 5 hours reveals that there is a close correlation between the model parameter and the remaining capacity, as shown in FIG. 6.

The time required for measuring the impedance spectrum in each discharge state and calculating the model parameter by approximation did not exceed 420 seconds.

[Embodiment 3]

Lithium ion batteries with nominal capacity of 1300 mAh with unknown user history are fully charged in the same manner as Example 2. Then impedance spectum is measured to calculate a model parameter, charge transfer resistance $R_{ct}$.

Figure 7:
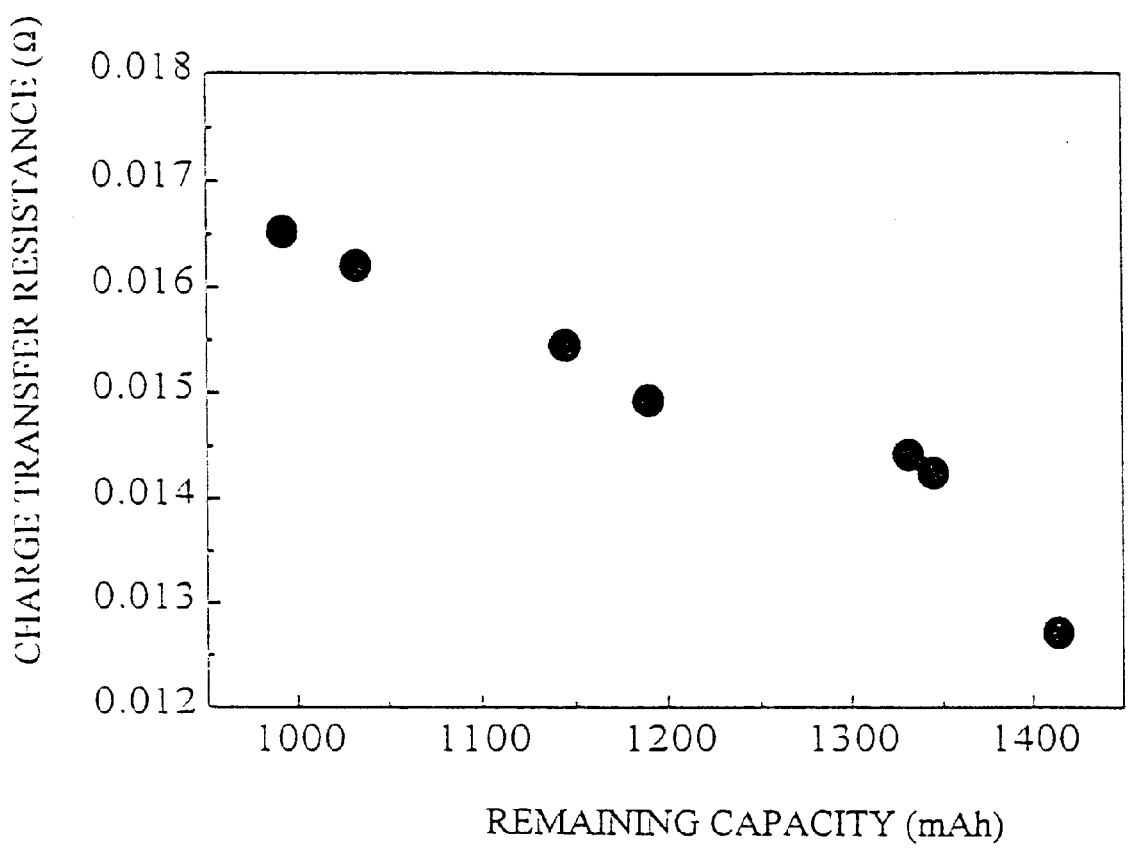
FIG. 7 illustrates a correlation between the discharge capacity of a fully charged lithium ion battery and selected model parameter.
Figure 8:
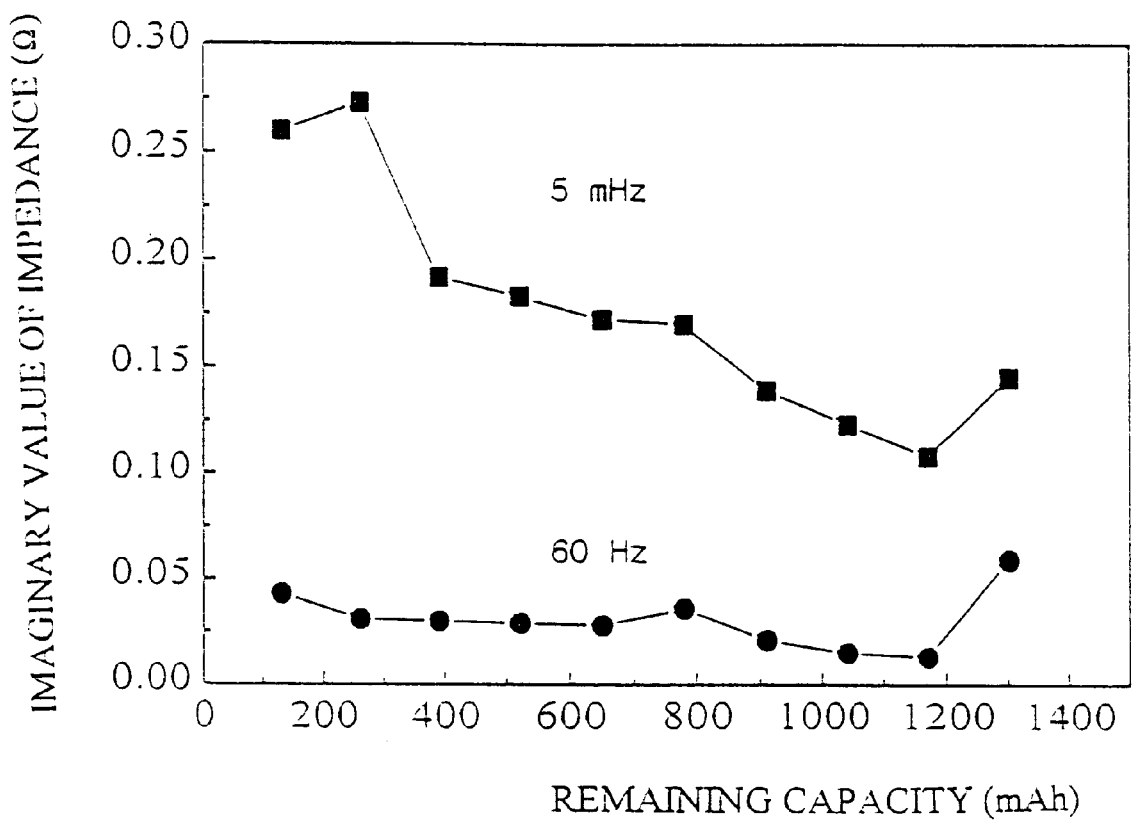
FIG. 8 illustrates a correlation between the remaining capacity of a lithium ion battery based on the discharge state and impedances at frequencies of 5 mHz and 60 1 Hz.

These batteries are discharged down to the final voltage of 2.7 V at a constant current of five-hour rate at room temperature and the discharge capacity of each battery is calculated. A comparison of the discharge capacity shows a correlation between the model parameter and the diacharge capacity, as illustrated in FIG. 7.

The time required for measuring the impedance spectrum for each battery and calculating the model parameter by approximation did not exceed 420 seconds.

[Embodiment 4]

Comparative Example 1

A comparison of the remaining capacity of battery and impedance at specified frequencies (5 mHz, 60 Hz instead of model parameter for the impedance spectrum measured in Embodiment 2 reveals that there is no close correlation between the impedance at each frequency and the remaining capacity.

[Embodiment 5]

Comparative Example 2

Figure 9:
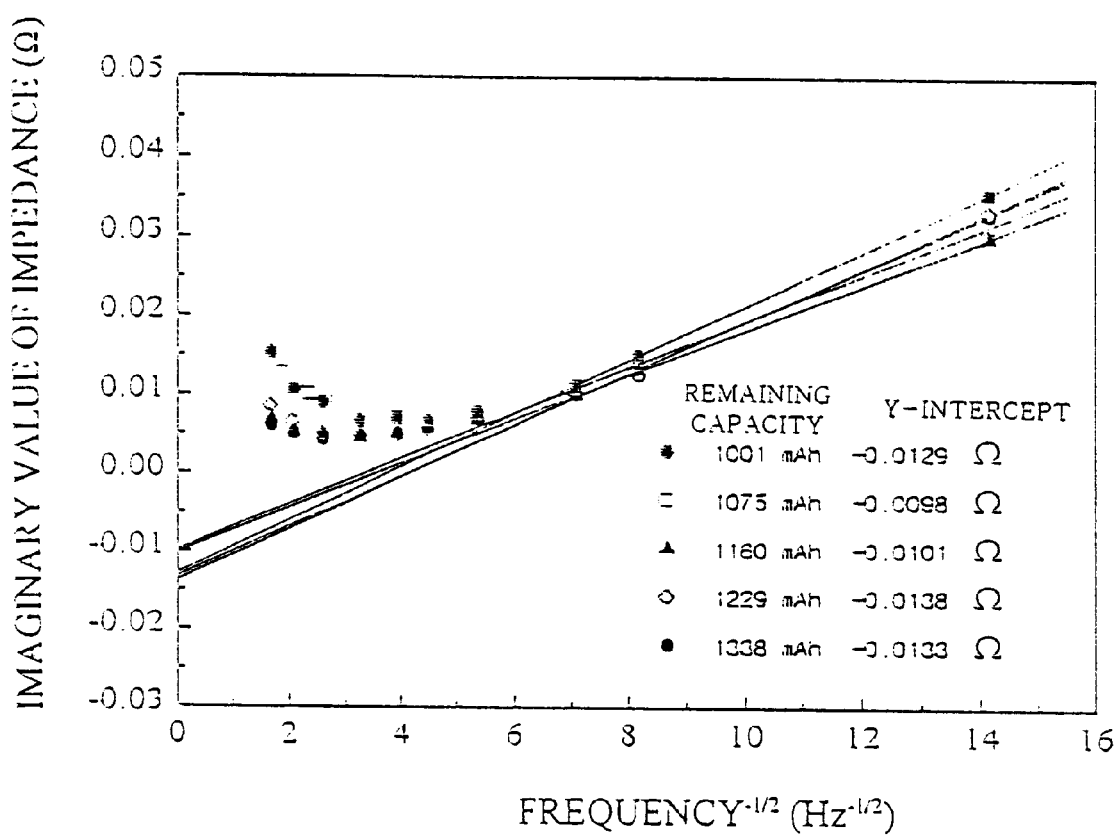
FIG. 9 illustrates a correlation between the remaining capacity of a lithium ion battery based on the discharge state and the frequency dependence of impedance in the lower frequency region.

To compare the remaining capacity of battery and the numerical value derived from the frequency dependence of real or imaginary part of the internal impedance of battery, obtained or extrapolated from relatively narrow frequency range, instead of calculating model parameters for the impedance spectrum measured in Embodiment 2, the relationship is examined between the imaginary value of impedance in the lower frequency region and the square root of the frequency. As a result, no close correlation is found between the absolute value and the remaining capacity, as illustrated in FIG. 9.

Such as in the present invention described above, a measurement for a known battery capacity by measuring and analyzing the characteristic impedance spectrum of primary and secondary batteries is more excellent in efficiency and accuracy than the related art measurement for battery capacity. Such a measurement can be used for the user to measure the capacitance of primary and secondary batteries used for electrical appliances, electronic apparatus, communication equipment, automobiles and electric vehicles, or to measure or grade the battery capacity in production of the regulated primary and secondary batteries on a large scale.

It will be apparent to those skilled in the art that various modifications and variations can be made in the present invention without departing from the spirit or scope of the invention.

Thus, it is intended that the present invention cover the modifications and variations of this invention provided they come within the scope of the appended claims and their equivalents.

What is claimed is:

1. A method of measuring battery capacity by measurement and analysis of impedance spectrum, which is to measure a characteristic impedance spectrum of primary and secondary batteries and determine the battery capacity the method comprising the steps of:
   (1) measuring the characteristic impedance spectrum of a battery in a predetermined frequency region;
   (2) determining one or more parameter from the measured impedance spectrum;
   (3) monitoring in advance the correlation between the determined model parameter and the battery capacity measured by a real-time discharge technique; and
   (4) determining the battery capacity from the characteristic impedance spectrum of a battery having an unknown capacity based on the monitored correlation.

2. The method as claimed in claim 1, wherein the predetermined frequency region has the ratio of the highest and lowest frequencies is at least 100.

3. The method as claimed in claim 1, wherein the parameter is a model parameter determined by fitting the measured impedance spectrum to an impedance function obtained from an equivalent circuit comprising resistances, capacitors and model parameters of transmission lines.

4. The method as claimed in claim 1, a complex nonlinear least square fitting method is used for obtaining model parameters in the impedance function fitting of the characteristic impedance spectrum.

5. The method as claimed in claim 1, wherein the input signal is applied to both terminals of battery under galvanostatic conditions.

6. The method as claimed in claim 1, wherein the characteristic impedance spectrum is measured by a Fourier transform impedance measurement using input signal consisting of finite multiple freuqency.

7. An apparatus for measuring battery capacity by impedance spectrum analysis, the apparatus comprising:
   a battery connector unit having a battery connected thereto;
   a measurement unit for applying an input current corresponding to a digital input signal composed of a superposition of predefined finite multiple frequencies to both terminals of the battery via the battery connector unit, and converting input current and output voltage applied to both terminals of the battery into a digital signal continuously; and
   a central control unit for storing the digital signal output from the measurement unit, converting the digital signal to a complex digital impedance expressed by a function of frequency by performing a Fourier transform, and fitting the complex impedance to a predefined model parameter or a plural of model parameters.

8. The apparatus as claimed in claim 7, wherein the battery connector unit and the measurement unit are provided more than one in number and output the continuously converted digital signal to multi-channels, inputting the digital signal to the central control unit.

9. The apparatus as claimed in claim 7, wherein the measurement unit comprises:
   a digital signal memory device for storing the digital input signal composed of a superposition of predefined finite multiple frequencies;
   a constant current source for applying an input current corresponding to the digital input signal memorized in the digital signal memory device in advance to both terminals of the battery via the battery connector unit; and
   an analog/digital converter for converting the input current and output voltage applied to both terminals of the battery to a digital signal continuously and inputting the digital signal to the central control unit.

10. The apparatus as claimed in claim 7, wherein the central control unit comprises:
- a central processing unit for performing a measurement of the battery capacity;
- a memory device for storing and outputting the digital signal of the input current and output voltage applied to both terminals of the battery from the plural meter units;
- an I/O unit for outputting a predetermined control signal to the plural meter units and inputtung a predetermined measured signal from the plural meter units under the control of the central processing unit;
- a Fourier transformer for Fourier transforming the measured value of the plural measurement units into a complex impedance expressed by a function of frequency under the control of the central processing unit; and
- an impedance function fitting unit for converting the complex impedance Fourier transformed at the Fourier transformer into a predefined model parameter or a plural of model parameters.

11. The apparatus as claimed in claim 8, wherein the measurement unit comprises:
- a digital signal memory device for storing the digital input signal composed of a superposition of predefined finite multiple frequencies;
- a constant current source for applying an input current corresponding to the digital input signal memorized in the digital signal memory device in advance to both terminals of the battery via the battery connector unit; and
- an analog/digital converter for converting the input current and output voltage applied to both terminals of the battery to a digital signal continuously and inputting the digital signal to the central control unit.

* * * * *